United States Patent [19]

Frank et al.

[11] 4,312,043
[45] Jan. 19, 1982

[54] APPARATUS AND METHOD FOR DETERMINING THE INTEGRITY OF A DISTRIBUTOR FOR AN ENGINE

[75] Inventors: Howard Frank, Skokie; John W. Swafford, Jr., Glenview; Perry Farazi; Arvind M. Patel, both of Chicago; Cheuk-Wah Chan, Highland Park; Edward J. Dohnal, Chicago; Clark S. Wang, Elk Grove Village; Ashokkumar D. Mehta, Des Plaines, all of Ill.

[73] Assignee: Sun Electric Corporation, Crystal Lake, Ill.

[21] Appl. No.: 132,405

[22] Filed: Mar. 21, 1980

[51] Int. Cl.³ .............................................. G01R 13/42
[52] U.S. Cl. ...................................... 364/551; 73/116; 235/92 MP; 324/385; 324/391; 364/424
[58] Field of Search ................... 364/424, 550, 551; 324/378, 380, 385, 391, 392; 235/92 MP, 92 MT; 73/116

[56] References Cited

U.S. PATENT DOCUMENTS

| | | | |
|---|---|---|---|
| 3,767,902 | 10/1973 | Estes et al. | 235/92 MP |
| 3,986,009 | 10/1976 | Fastaia | 324/392 |
| 4,070,613 | 1/1978 | Brady | 324/392 |
| 4,081,995 | 4/1978 | Griffith et al. | 73/116 |
| 4,178,541 | 12/1979 | Brihier | 324/385 |
| 4,179,922 | 12/1979 | Bouverie et al. | 364/551 |
| 4,188,820 | 2/1980 | Moser et al. | 73/116 |
| 4,235,101 | 11/1980 | Stadelmann | 73/116 |

*Primary Examiner*—Errol A. Krass
*Attorney, Agent, or Firm*—Allegretti, Newitt, Witcoff & McAndrews

[57] ABSTRACT

An apparatus and method for detecting a defective distributor is shown. The apparatus includes an input system providing the time of each cylinder firing after an initial firing of cylinder #1. A processor then determines the deviation between the actual time of firing and an optimum time thereof.

9 Claims, 2 Drawing Figures

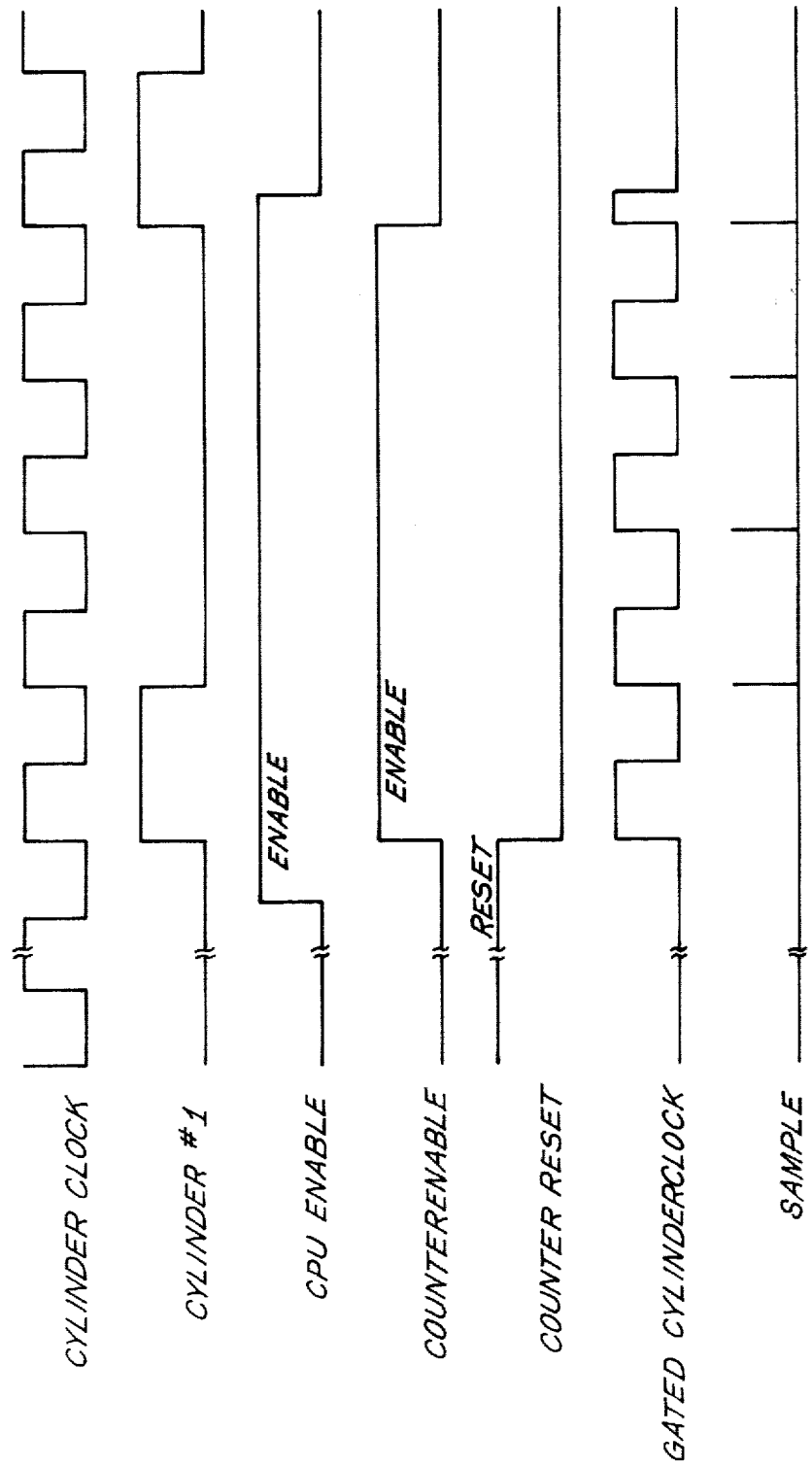

APPARATUS AND METHOD FOR DETERMINING THE INTEGRITY OF A DISTRIBUTOR FOR AN ENGINE

BACKGROUND OF THE INVENTION

The present invention relates to an apparatus and method to determine the operational state, or integrity, of a distributor-based ignition system. In more particular terms, the present invention relates to detection of a defective distributor within an ignition system.

A defective distributor may adversely effect the timing and performance of an internal combustion engine. Presently, the only method for determining a defective distributor requires removal thereof from the engine. The distributor is then hand tested using a timing light and related test equipment. The test is inordinately time-consuming.

SUMMARY OF THE INVENTION

The present invention is an apparatus and method for determining the integrity of a distributor without removal from the automobile. The apparatus includes an input system for producing a signal representing the time of each cylinder firing after the firing of a reference cylinder (usually cylinder #1), a processor and a display. The time between the initial firing of the reference cylinder and the next firing thereof defines the total firing time.

Operation of the processor is amply described by the method of determining distribution integrity. Utilizing the input signal, the actual rotational position of the crankshaft (in degrees) is determined for each cylinder firing. The expected rotational position of the crankshaft for optimum firing or timing is then determined. Finally, the deviation between each of the actual and expected rotational positions is calculated, and a symbol representative of the deviation is visually shown on the display.

It is thus an object of the present invention to provide an improved system for determining the operating condition of an ignition system and particularly the distribution thereof. Another object is a distributor testing system which avoids removal of the distributor from the engine during testing. Still another object is a reliable, yet inexpensive distributor test system.

These and other objects, features and advantages of the present invention are set forth or suggested in the following description.

BRIEF DESCRIPTION OF THE DRAWING

A preferred embodiment of the present invention is described herein, in detail, with reference to the drawing, wherein:

FIG. 2 is a timing diagram illustrating various signals generated by and utilized in the preferred embodiment shown in FIG. 1.

DESCRIPTION OF A PREFERRED EMBODIMENT

Figure 1:
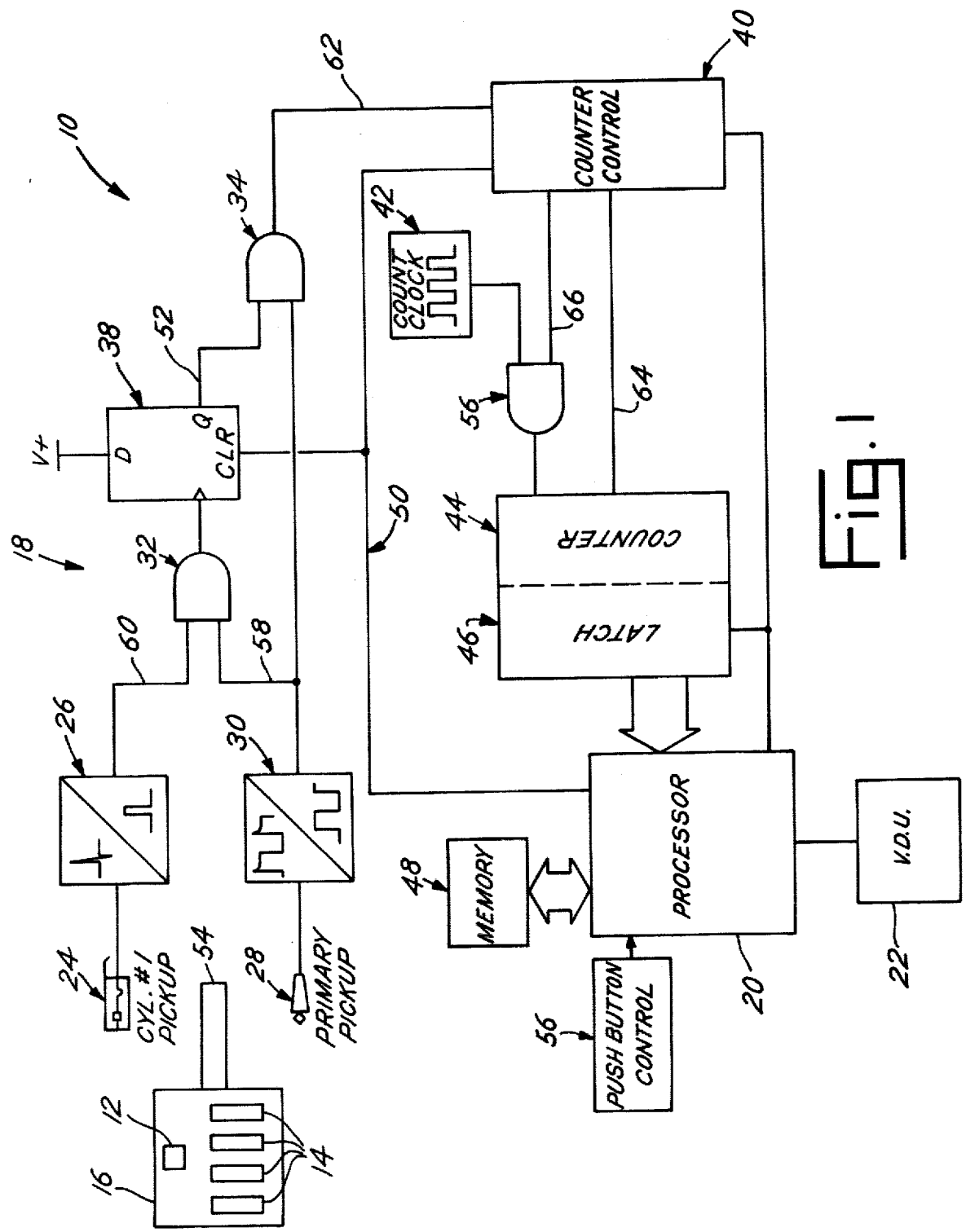
FIG. 1 is a schematic diagram of a preferred embodiment.

Referring to FIG. 1, the present invention is an apparatus 10 for determining the integrity of a distributor 12. As shown, the distributor 12 controls the firing of cylinders 14 in an internal combustion engine 16.

More particularly, the apparatus 10 includes input means, generally designated 18, processor means 20 and display means 22. The input means 18 consists of a cylinder #1 pick-up 24, a shaping circuit 26 for the pick-up 24, a primary pick-up 28, a shaping circuit 30, gates 32, 34, 36, flip-flop 38, counter control 40, clock 42, counter 44 and latch 46, interconnected as shown. The processor means 20 includes a memory 48 and is interconnected with the input means 18 and the display means 22 as shown.

Referring to FIGS. 1 and 2, the processor means 20 initiates a distributor test by issuing a command, CPU ENABLE, on line 50. This command enables the flip-flop 38 and counter control 40. Primary singals, CYLINDERCLOCK, from the primary pick-up 28, shaped by the circuit 30, pass to the gate 32 on line 58. When cylinder #1 fires, the cylinder #1 pick-up 24 provides a signal CYLINDER #1, at the gate 32 by line 60, after shaping by the circuit 26.

The gate 32 detects a coincidence between the signals CYLINDERCLOCK and CYLINDER #1 and responsively sets an output 52 of the flip-flop 38 to a logical "1" state, thereby enabling the gate 34. This allows a modification of the signal CYLINDERCLOCK, shown in FIG. 2 as GATED CYLINDERCLOCK, to pass to the counter control 40 on line 62.

As GATED CYLINDERCLOCK is received by the counter control 40, and in response to the first rising edge (corresponding to the firing of cylinder #1), the counter control 40 generates a COUNTER RESET signal on line 64 and a COUNTER ENABLE signal on line 66, received by the counter 44 and gate 36, respectively. The counter 44 responsively resets to zero and, now reset, begins counting clock pulses from the clock 42 received through the gate 36.

The second rising edge of the signal GATED CYLINDERCLOCK (corresponding to the firing of cylinder #2) causes counter control 40 to generate a SAMPLE signal received by the processor means 20 and latch 46, whereby the time data in counter 44 is transferred to the latch 46. The SAMPLE signal causes an interrupt in the processor means 20, and data transferred to the latch 46 is read by the processor means 20 and stored in the memory 48.

The processor means 20 counts the number of SAMPLE pulses and, when equal to the number of cylinders 14 in the engine 16, the processor means 20 disables the flip-flop 38 and counter control 40, terminating data acquisition. Until termination, the counter 44 continuously clocks, i.e., counts clock pulses. The counter 44 thus gathers data representing the accumulated time between the initial firing of cylinder #1 and the next firing thereof, with the data being intermittently transferred to the latch 46 whenever a rising edge of the GATED CYLINDERCLOCK signal is received by the counter control 40.

As such, the input means 18 provides to the processor means 20 a signal, or data, representing the time of each cylinder firing after a first or initial firing of cylinder #1. The time between the first firing of cylinder #1 and the next firing thereof, i.e., the total accumulated count made by the counter 44, is defined as the total firing time.

The processor means 20 now calculates the optimum time or point, in terms of the rotational position of the crankshaft 54, for each cylinder firing. Assuming a four cycle engine, the formula for this calculation is:

$$\text{OPTIMUM POINT } (X) = \frac{720° \cdot (X - 1)}{N}$$

where X represents the cylinder number, e.g., 1, 2, 3, or 4 in a four cylinder engine 16, and N represents the total number of cylinders, e.g., 4. The optimum rotational position of the crankshaft for firing of cylinder #3 in a four cycle, four cylinder engine 16 is thus 360°. The calculated optimum positions of the crankshaft 54 are stored in the memory 48.

The processor means 20 then calculates the time or point, in terms of the rotational position of the crankshaft 54, of the actual firing for each cylinder 14. Since the crankshaft 54 rotates 720° between firings of the cylinder #1, each clock pulse represents an incremental rotation of the crankshaft, as expressed below:

$$\text{DEGREES OF CRANKSHAFT ROTATION PER COUNT} = \frac{720°}{\text{TOTAL COUNT BETWEEN FIRINGS OF CYLINDER \#1}}$$

The actual rotational position of the crankshaft 54 at the firing of each cylinder 14 is then derived as follows:

$$\text{DEGREES }(X) = \text{COUNT }(X) \cdot \text{DEGREES/COUNT}$$

where COUNT (X) represents the count read from the latch 46 and stored in the memory 48 when the cylinder X fired.

Finally, the processor means 20 calculates the deviation, or absolute difference, between the optimum predicted position and the actual position of the crankshaft 54 at the time of each cylinder firing. Preferably, the maximum deviations of four consecutive tests are stored and averaged. The processor means 20 then generates a signal representative of the average deviation, which is received by the display means 22. The display means 22 visually displays a symbol representative of or corresponding to the deviation, e.g., 8°, and the operator of the apparatus 10 determines therefrom whether the distributor 12 should be replaced. The range of deviation for an acceptable distributor 12 is most appropriately determined by the distributor manufacturer: however, an average deviation less than 3° appears reliable.

The number of cylinders 14 in the engine 16 under test is stored in the memory 48. In this preferred embodiment, the number of cylinders 14 is entered by a push button control 56, coupled to the processor means 20 for addressing the memory 48.

The teaching of U.S. Pat. No. 4,125,894 are incorporated herein by reference. This patent describes in detail the coupling of an engine test system to an automobile engine, the pick-up of ignition signals, the shaping thereof, the generation of timing signals therefrom and the operation of a processor for determining engine performance based upon the generated timing signals.

A single preferred embodiment of the present invention has been described herein. The true scope and spirit of the present invention are limited, however, only by the following claims as interpreted in light of this specification as a whole.

What is claimed is:

1. An apparatus for determining the integrity of a distributor for an engine, said engine having a predetermined number of cylinders, a reference cylinder, and a crankshaft, comprising, in combination:

input means, responsive to operation of said engine and said distributor, for generating an input signal representing the time of firing of each of said cylinders after a first firing of said reference cylinder, the time between said first firing of said reference cylinder and the next firing thereof being the total firing time;

processor means, responsive to said input means, for receiving said input signal and determining therefrom the actual rotational position of said crankshaft at the time of firing of each of said cylinders, said processor means further determining, based upon said predetermined number of cylinders and said total firing time, the optimum rotational positions of said crankshaft for firing of said cylinders, respectively, said processor means further calculating the deviation between said actual rotational position and said optimum rotational position for each firing of said cylinders, said processor means generating a deviation signal representative of said deviation; and display means for receiving said deviation signal and displaying a symbol in response thereto, said symbol being representative of said deviation.

2. An apparatus as claimed in claim 1 wherein said input means includes a clock for generating clock pulses and a counter selectively coupled to said clock.

3. An apparatus as claimed in claim 2 wherein said counter begins counting said clock pulses in response to a command provided by said processor means and said first firing of said reference cylinder.

4. An apparatus as claimed in claim 3 wherein said input means further includes a counter control, responsive to said command and said first firing of reference signal, for coupling said counter to said clock.

5. An apparatus as claimed in claim 4 wherein said input means further includes a latch interconnected to said counter and coupled to said processor means.

6. An apparatus as claimed in claim 5 wherein said counter control issues a SAMPLE pulse and thereby causes a transfer of the number of clock pulses counted by said counter to said latch for reading by processor means whenever one of said cylinders fires after said first firing of said reference cylinder.

7. An apparatus as claimed in claim 6 wherein said processor means receives and counts said SAMPLE pulses, said processor means disabling said input means whenever the number of SAMPLE pulses equals said predetermined number of cylinders.

8. An apparatus as claimed in claim 1 or 7 further comprising means for inputting to said processor means said predetermined number of cylinders.

9. A method of determining the integrity of a distributor of an engine, said engine having a predetermined number of cylinders, a reference cylinder, and a crankshaft, comprising the steps of:

timing the firing of each of said cylinders with respect to a first firing of said reference cylinder, the time between said first firing and the next firing of said reference cylinder being the total firing time;

calculating, based upon said predetermined number of cylinders, said total firing time and said times of firing, an actual rotational position of said crankshaft at each of said times of firing;

calculating, based upon said predetermined number of cylinders and said total firing time, an optimum rotational position of said crankshaft for the firing of each of said cylinders; and determining a deviation between said actual rotational position and said optimum rotational position for each firing of said cylinders.

* * * * *